United States Patent
Baumgartner et al.

(10) Patent No.: US 7,788,618 B2
(45) Date of Patent: Aug. 31, 2010

(54) SCALABLE DEPENDENT STATE ELEMENT IDENTIFICATION

(75) Inventors: Jason Baumgartner, Austin, TX (US); Geert Janssen, Putnam Valley, NY (US); Robert Kanzelman, Rochester, MN (US); Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 11/864,944

(22) Filed: Sep. 29, 2007

(65) Prior Publication Data

US 2009/0089730 A1    Apr. 2, 2009

(51) Int. Cl.
    *G06F 17/50*    (2006.01)
(52) U.S. Cl. .................. 716/7; 716/4; 716/5; 716/6; 703/13
(58) Field of Classification Search .......... 716/4–7; 703/13
    See application file for complete search history.

(56) References Cited

U.S. PATENT DOCUMENTS

| 6,421,815 | B1 * | 7/2002 | Seawright | 716/7 |
| 6,944,838 | B2 * | 9/2005 | McMillan | 716/5 |
| 7,092,858 | B1 * | 8/2006 | Kukula et al. | 703/2 |
| 7,127,686 | B2 * | 10/2006 | Drechsler et al. | 716/4 |
| 7,322,017 | B2 * | 1/2008 | Baumgartner et al. | 716/5 |
| 7,360,185 | B2 * | 4/2008 | Baumgarter et al. | 716/5 |
| 7,506,278 | B1 * | 3/2009 | Rjimati et al. | 716/3 |
| 2002/0023256 | A1 * | 2/2002 | Seawright | 716/18 |
| 2004/0199887 | A1 | 10/2004 | Jain et al. | |
| 2006/0058989 | A1 * | 3/2006 | Keidar-Barner et al. | 703/13 |
| 2006/0085782 | A1 * | 4/2006 | Ward | 716/18 |
| 2006/0190864 | A1 * | 8/2006 | Ganai et al. | 716/5 |
| 2007/0089075 | A1 * | 4/2007 | Ward | 716/4 |

OTHER PUBLICATIONS

Govindaraju et al., Improved Approximate Reachability using Auxiliary State Variables, Design Automation Conference, Proceedings. 36[th.] Jun. 21-25, 1999 pp. 312-316.*

"Functional Dependency for Verification Reduction"; Jie-Hong R. Jiang and Robert K. Brayton; Dept. of Electrical Engineering and Computer Sciences, Univ. of California, Berkely (CAV 2004, LNCS 3114, pp. 268-280, 2004) Springer-Verlag Berlin Heidelberg 2004.

* cited by examiner

*Primary Examiner*—Naum B Levin
(74) *Attorney, Agent, or Firm*—The Brevetto Law Group (57) ABSTRACT

Methods, systems and software products are provided to enhance the scalability of dependent state analysis element identification. In a method of partitioning a model representing a state machine, a variable is selected from the variables of the model, and a first set of variables are identified that support the selected variable. Then a second set of variables is identified that have overlapping support of the first set of variables. The second set of variables is a partition suitable for use in determining an overapproximation of the reachable states of the selected variable.

20 Claims, 7 Drawing Sheets

SCALABLE DEPENDENT STATE ELEMENT IDENTIFICATION

BACKGROUND

1. Field

The present invention relates to modeling and testing digital designs of state machines, and more specifically, to systems, methods and computer products for the identification of dependent state variables to aid in logic design and verification.

2. Background

A system such as an electrical circuit including state holding elements may be modeled using state equations and state variables that describe the behavior and state of the system. A complete set of state variables for a system typically contains enough information about the system's history to enable computation of the system's future behavior. Simplifying the model to reduce the number of state variables lessens the computational cost of analyzing the model, for example, to verify that it conforms to a given specification.

Dependent state element identification refers to the process of identifying those state variables in a design (e.g. latches or registers) that can be expressed as combinational (Boolean) functions of other state variables. A special case of dependent state variables are redundant state variables, in which two registers evaluate to the same value at all points in time. For example, one register may be expressible as a function of other registries, e.g., register1 may be equal to the AND of register2 and register3 for all points in time. In such a situation, the register1 state variable is said to be redundant in view of register2 and register3.

The computations needed to verify a system design tend to become very expensive as the model being analyzed increases in complexity. Verification paradigms typically suffer exponential runtime with respect to the number of state elements of the design. By identifying the dependent state variables, the system model can be expressed with a fewer number of state elements, streamlining the formal verification paradigm. Identifying the dependent state variables is also useful in analyzing and enhancing circuit design, often resulting in reductions to circuit size for a particular application.

What is needed is an efficient way to identify dependent state variables and streamline the verification process. This disclosure introduces several mechanisms to enhance the speed and scalability of dependent state element identification.

SUMMARY

The embodiments disclosed herein address the above stated needs by providing systems, methods and computer products for verifying that system designs conform to specified parameters.

Various embodiments partition the system model into smaller sized, independent reachable state overapproximations. Such overapproximation partitions tend to reduce the exponential complexity and associated computational resource consumption required for system design verification. Through the elimination of dependent variables the various embodiments can be used to reduce the system design size and complexity, thus enhancing the efficiency of analysis and verification. A state machine model is partitioned by first selecting a variable in the model and identifying a first set of variables that support the selected variable. Then a second set of variables is then identified that have support overlapping the first set of variables, this second set of variables constituting a design partition upon which overapproximation of the reachable states for the selected variable will be performed.

Various embodiments involve truncating a reachability analysis of a model. The decision to truncate the reachability analysis is made by iteratively computing reachable states of a design or partition thereof. The reachability computations are interrupted at predefined junctures to perform a dependency check, and if the selected variable is determined to have no remaining dependencies the reachability analysis can be truncated.

Various embodiments involve pruning a model during a reachability analysis. A variable is selected upon completing a reachability iteration to determine whether or not it contributes to dependency of the variable being analyzed. If the selected variable does not contribute to dependency of said variable being analyzed it is discarded.

In other various embodiments that involve pruning a model during a reachability analysis, a variable is selected upon completing a reachable state iteration. The selected variable is removed from the current state set to create a new state set. If it is determined that the variable being analyzed is dependent on the new state set it is retained for continuing with the reachability analysis without the selected variable, otherwise the selected variable is added back to the state set for further reachability calculations.

Some embodiments involve a system configured to partition a model including multiple variables representing state elements. In such embodiments the system may include an electronically readable storage medium configured to store the variables, a device for receiving inputs to select a variable from among the multiple variables of the model, a processor configured to execute instructions to identify a first set of variables among the multiple variables that each support said selected variable, and to identify a second set of variables among the plurality of variables that each have support overlapping said first set of variables, and a display device configured to display a representation of said second set of variables which is a partition of state elements suitable for use in determining an overapproximation of reachable states of said selected variable.

Other embodiments involve a system configured to truncate a reachability analysis including reachability iterations for a model with multiple variables representing state elements. In such embodiments the system may include an electronically readable storage medium configured to store the multiple variables representing state holding elements in said model, a device configured to receive an input to select a variable from the plurality of variables, a processor configured to execute instructions to create a binary decision diagram for the selected variable, begin performing the reachability iterations for the model, interrupt the reachability analysis to perform a dependency check, and truncate the reachability analysis for the selected variable in response to said dependency check finding no remaining dependencies, and a display device configured to display results for the reachability analysis of the selected variable.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1A:
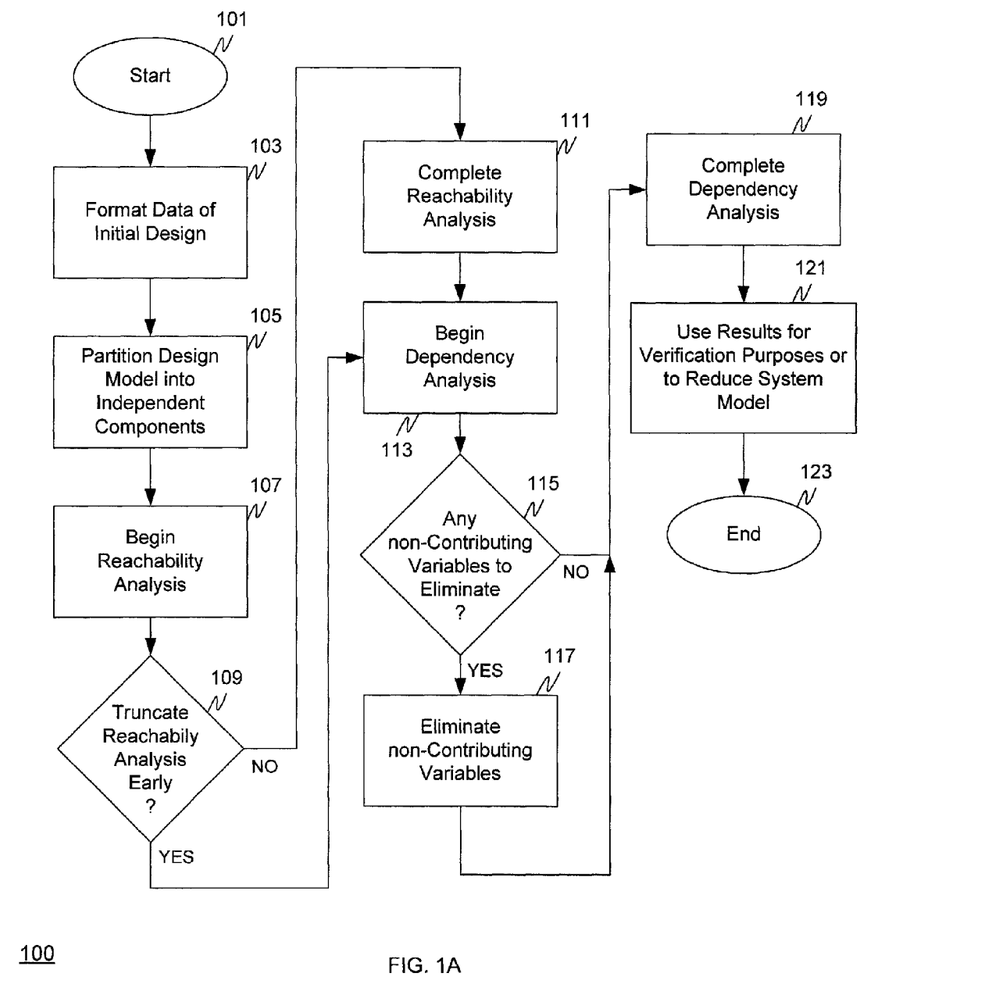
FIG. 1A is a flowchart depicting an overview of methods and processes performed in accordance with various embodiments.

FIG. 1A is a flowchart 100 depicting an overview of methods and processes performed in accordance with various embodiments. The method begins in 101 and proceeds to 103. One of the first tasks of the method 100 is to define the conventions and terms, set the initial conditions of the system model, and prepare the data in block 103. This often entails defining the netlist for the system design. An exemplary netlist contains a directed graph with vertices representing gates, and edges representing interconnections between those gates. The gates have associated functions, such as constants, primary inputs (which may be referred to as RANDOM gates), combinational logic such as AND gates, and sequential state holding elements. A sequential state holding element has one or more inputs and at least one output, each of which may be characterized by discrete states (e.g., 1 or 0). The various embodiments can be practiced with any sort of state machine including state holding elements (e.g., registers, latches, RAM circuitry, or the like). For illustrative purposes the terms "register," "gate" and "variable" are used interchangeably throughout this disclosure since certain netlist analysis techniques reason about variables. The state of the output (or the state of each output, if more than one) is determined by the previous states of the input channels. The initialization time or reset time of a register is referred to herein as time zero (t=0). Registers typically have two associated components, their next-state functions and their initial-value functions. Both of these associated components may be represented as other gates in the graph. Semantically, for a given register the value appearing at its initial-value gate at time "0" will be applied as the value of the register itself. The value appearing at its next-state function gate at time "i" will be applied to the register itself at time "i+1". Certain gates of the model may be labeled as targets. Targets correlate to the properties we wish to verify. One goal of the verification process is to find a way to drive a "1" to a target node, or to prove that no such assertion of the target is possible—that is, to verify whether or not the target node is reachable. Another goal may be to generate a counterexample trace illustrating this scenario, if one is found.

Figure 2:
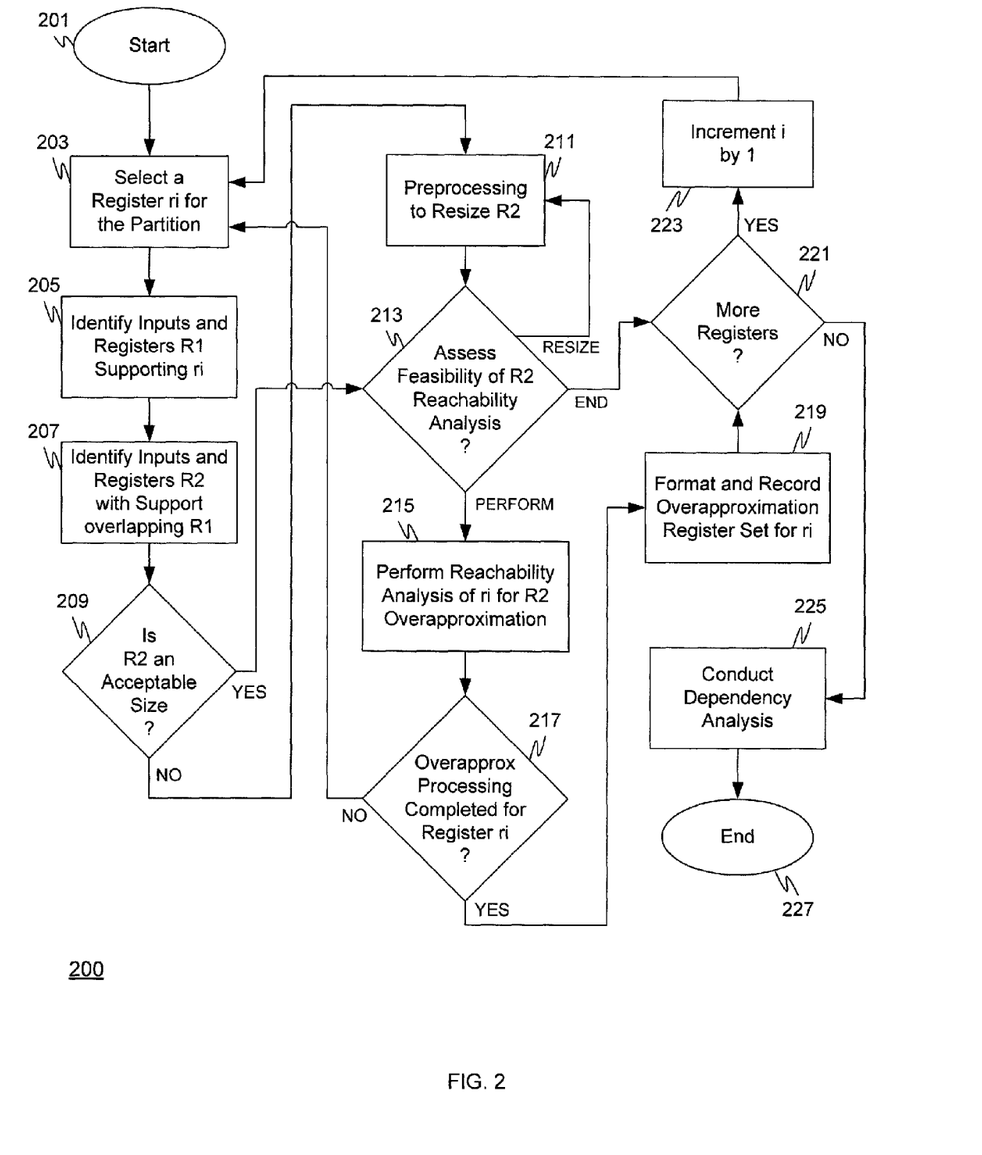
FIG. 2 is a flowchart depicting a method of partitioning a system design model into smaller, more computationally manageable components.

Upon completion of block 103 the method proceeds to 105. In 105 the system design model is partitioned into smaller, independent portions that are easier to handle for computations such as those in the reachability analysis. The reachability analysis tends to be computationally expensive, often requiring the most resources of any of the processes dealing with the design verification or system model modification. By breaking the system model into smaller, more easily managed components, efficiency gains can be realized, thus reducing computational costs. FIG. 2 depicts further details of a method for partitioning the system design model into smaller, more manageable components. Returning to FIG. 1A, once 105 has been completed and the system design model is partitioned into smaller, independent components, the method proceeds to 107.

Figure 3:
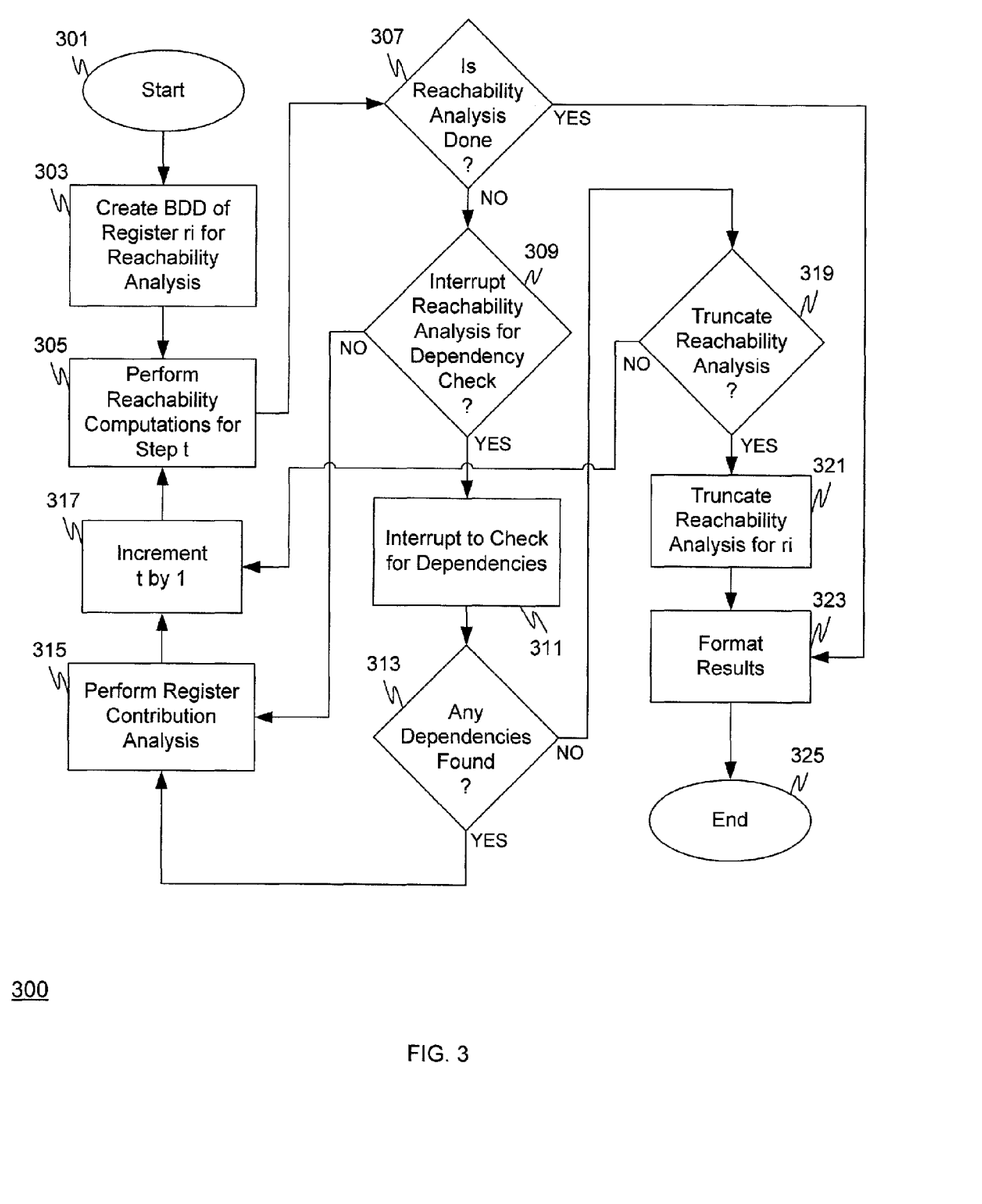
FIG. 3 is a flowchart depicting a method of the early termination of dependency analysis computations.
Figure 4A:
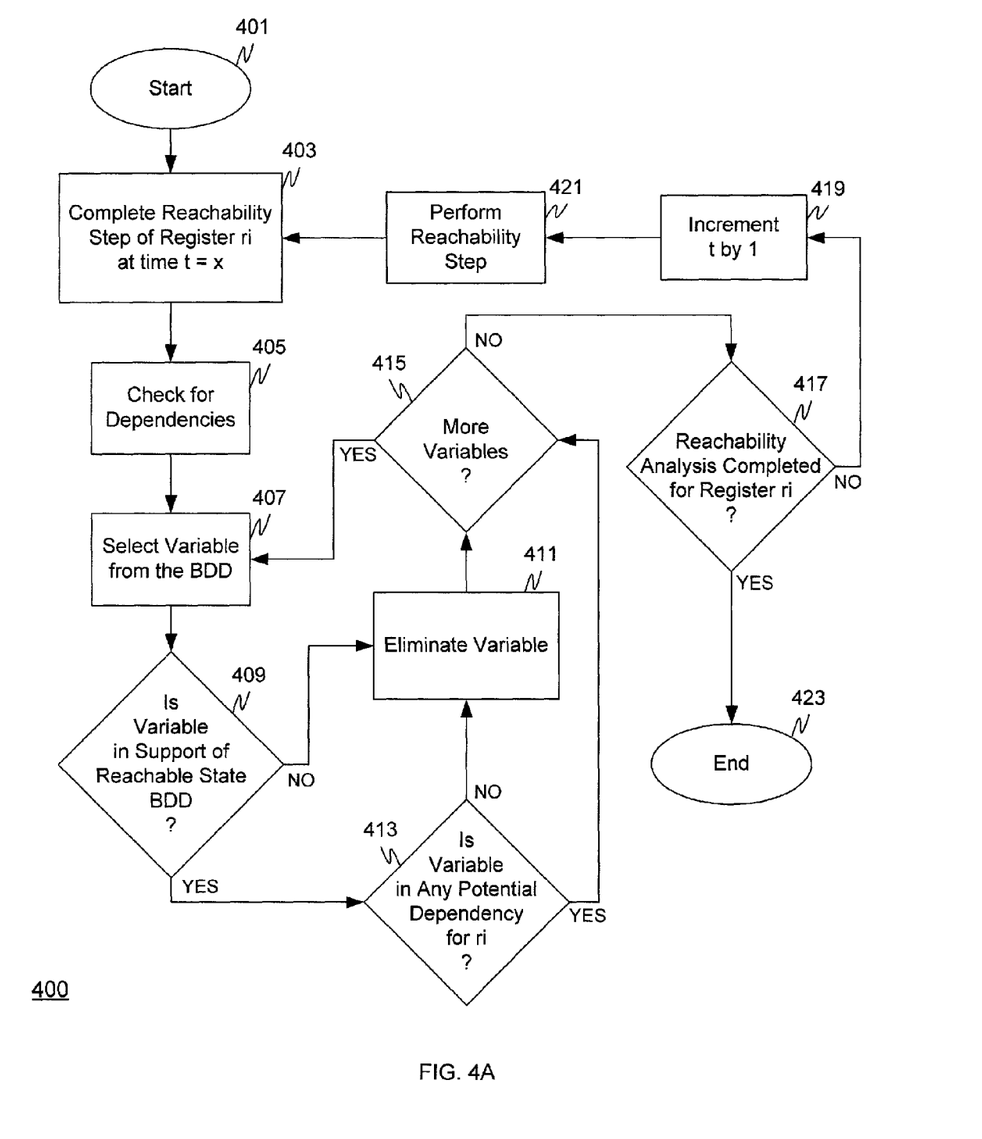
FIG. 4A is a flowchart depicting a first method to dynamically eliminate non-contributing variables based on the support of the binary decision diagram.
Figure 4B:
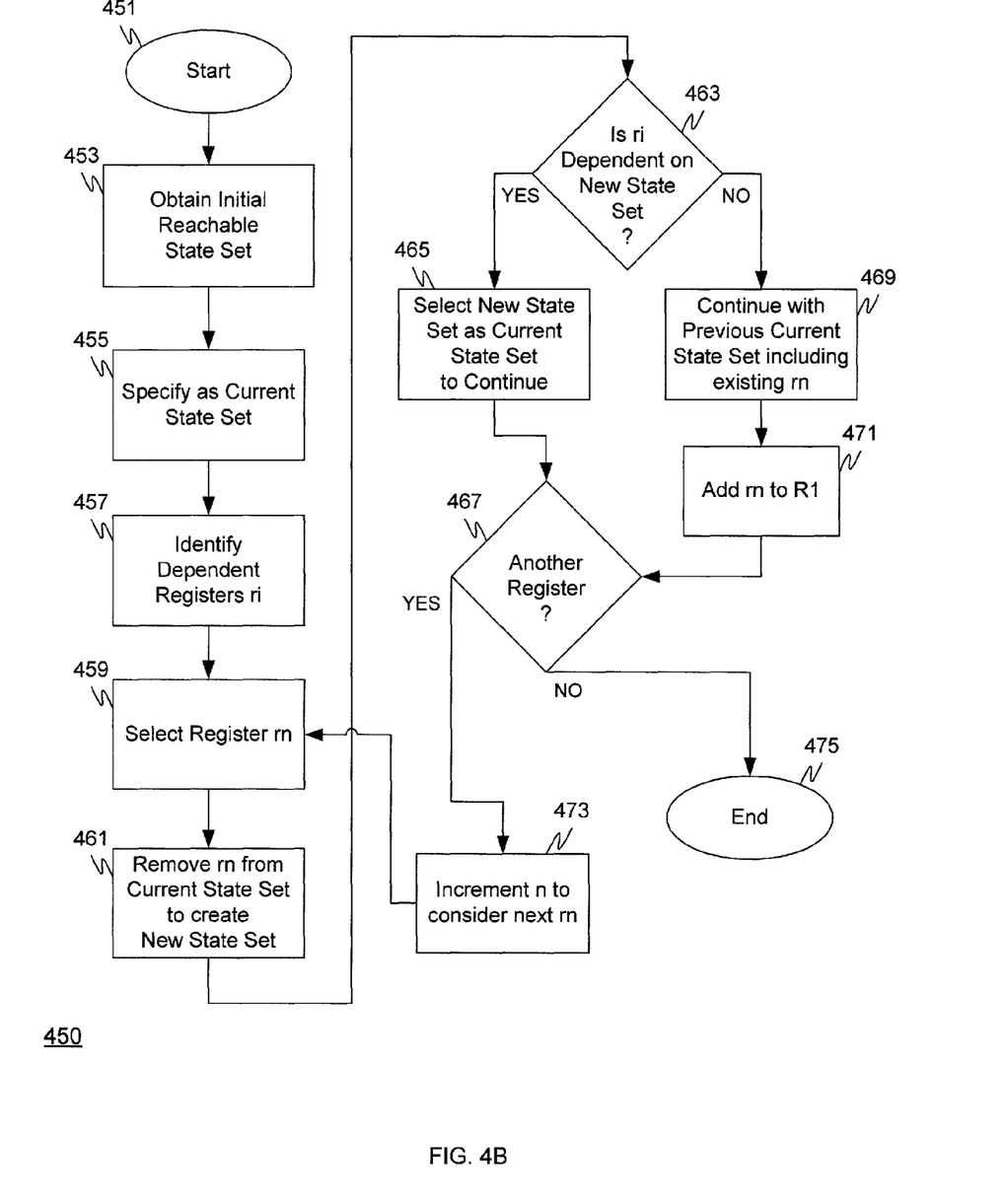
FIG. 4B is a flowchart depicting a second method to dynamically eliminate non-contributing variables based on an ability to contribute to a minimally sized dependency.

In 107 a reachability analysis is begun. The reachability analysis may be performed on each of the smaller, independent components resulting from the partitioning process of 105—that is, if the system model proved suitable for reducing into partitions in 105. A set of valuations to the registers is referred to as a "state." A state that can be reached from the initial states is referred to as a reachable state. A state that cannot be reached from the initial states is referred to as an unreachable state. FIGS. 4A-B depict further details of methods for improving the efficiency of the reachability analysis by pausing the reachability analysis to identify variables that can be discarded. Once the reachability analysis has been begun the method proceeds from 107 to 109 to determine whether the reachability analysis can be terminated early. FIG. 3 depicts further details of a method for truncating the reachability analysis early to improve computational efficiency. Returning to FIG. 1A, if it is determined in 109 that the reachability analysis cannot be truncated the method proceeds from 109 along the "NO" branch to 111 to complete the reachability analysis. In practice, the reachability analysis may be interrupted a number of times to determine whether it may be truncated at that juncture. Once the reachability analysis has been completed in 111 the method proceeds to 113 to begin a dependency analysis. However, back in 109 if it is determined that the reachability analysis can be safely terminated without incurring an unacceptable risk of inaccuracy the method proceeds from 109 along the "YES" branch to 113.

Figure 1B:
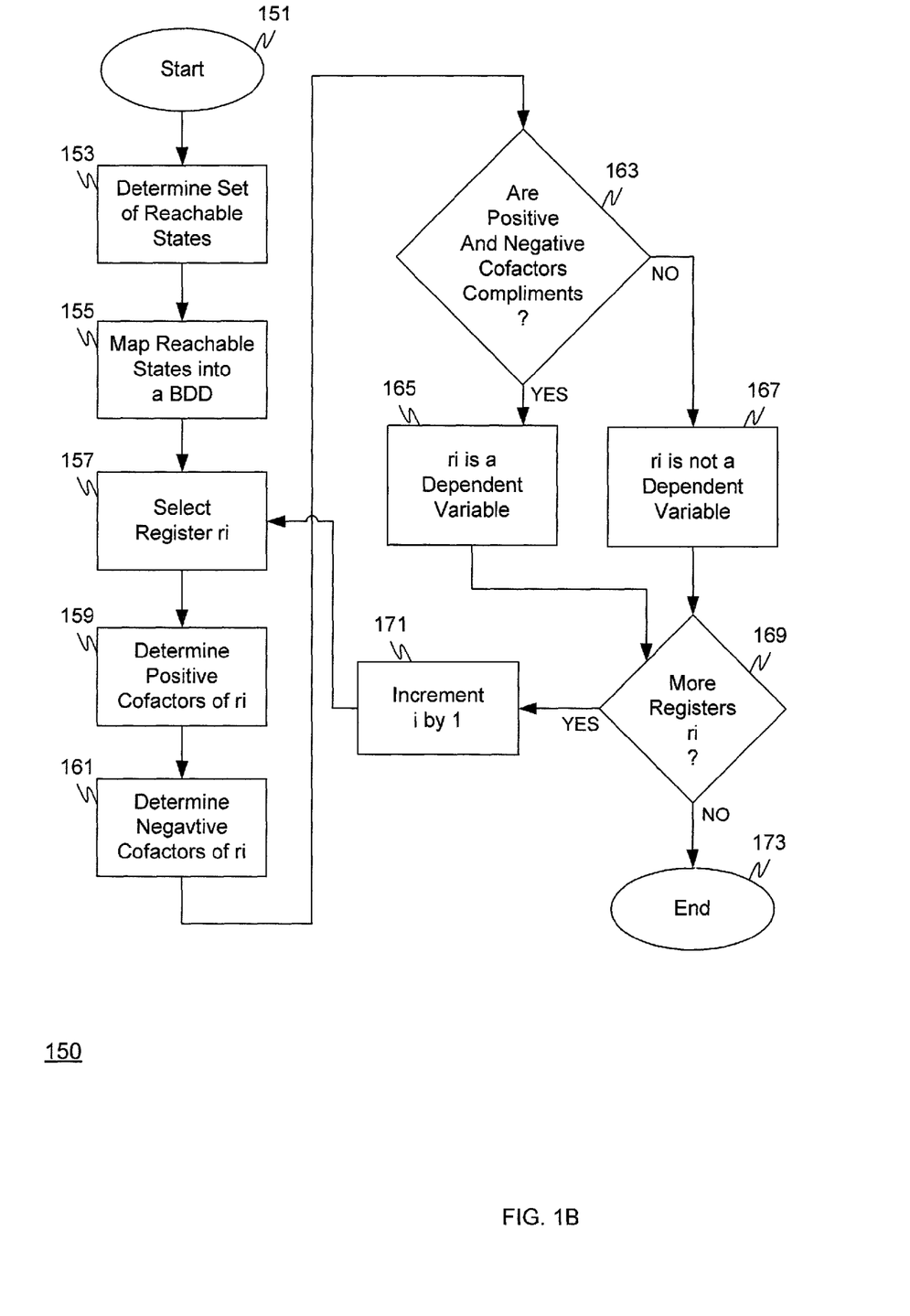
FIG. 1B is a flowchart depicting a methods of determining dependent variables.

In 113 a dependency analysis is performed on the various registers. Identifying and reducing dependent variables (registers) helps to streamline the computational efficiency of a system model. A register is a dependent variable if, for any reachable state, it may be expressed as a combinational function of the other registers. Dependent variables may be identified in various ways. For example, one such way of determining dependency is to map the set of reachable states into a data structure called a Binary Decision Diagram (BDD) and then use a BBD function such as bdd_cofactor to determine dependency. FIG. 1B depicts further details of this method for determining whether or not a register is a dependent variable. Returning to FIG. 1A, once the dependency analysis is begun in 113 the method proceeds to 115.

Although the dependency analysis tends to be less computationally intense than the reachability test, the efficiency of the dependency analysis may nonetheless be improved if there are fewer variables to perform it on. FIGS. 4A-B pause the reachability analysis for a dependency check of variables to determine whether they should be kept or discarded. The results from this test, performed as part of the reachability analysis, can be used to streamline the dependency check as well by removing non-contributing variables. In 115 if it is determined that there are any non-contributing variables (or it was determined previously as part of the reachability analysis), the method proceeds from 115 to 117 to eliminate any such non-contributing variables or registers. The method then proceeds to 119 to complete the dependency check.

Once dependent registers have been identified in the dependency analysis, the method proceeds to 121. In block 121 the results of the analysis are used, for example, for system model verification and testing purposes or to eliminate dependent registers and streamline the system circuit design. The method then proceeds to 123 and ends.

FIG. 1B is a flowchart depicting a method of identifying dependent variables. Identifying and eliminating dependent variables (registers) helps to streamline the computational efficiency of a system model. A register is called dependent if, for any reachable state, it may be expressed as a combinational function of the other registers. For example, given three registers (r1, r2, r3), if the set of all reachable states is (0,0,0), (1,0,1), (1,1,0), (1,1,1) then r1 may be expressed by the function (r2 OR r3). Hence, r1 is dependent on r2 and r3. The register r1 can be removed from the model, replacing it with the r2 OR r3 function. The method 150 of FIG. 1B begins in 151 and proceeds to 153 where the set of reachable states of the design is determined. Due to the high computation costs of determining the exact set of reachable states, an overapproximation of the reachable states of the design may instead be used. Upon completing 153 the method proceeds to 155.

In 155 the set of reachable states (or the overapproximation) is mapped into a BDD. A BDD, as known by those of ordinary skill in the art, is a graphical data structure used to represent Boolean functions. Mapping the reachable states into a BDD puts them in a format conducive to analysis and manipulation. The method then proceeds to 157 to select a register ri. Upon selecting a register, the method proceeds to 159 to determine the positive cofactors of ri for the reachable states—that is, all the reachable states when ri is set to 1. This may be done using a BDD function such as bdd_cofactor which restricts the BDD to only those states for which a given variable evaluates to a given value, then eliminates that variable from the support of the resulting BDD. Upon determining the positive cofactors the method proceeds to 161 to determine the negative cofactors associated with the reachable states when ri is set to 0. This may also be done using bdd_cofactor. The method then proceeds to 163.

The dependency of each register ri can be determined, in turn, by checking whether the bdd_cofactor of the state set BDD for ri=0 is the complement (opposite) of the state set BDD for ri=1. In other words, block 163 determines whether the positive and negative cofactors of ri are complements to each other. If they are found to be complements the method proceeds from 163 along the "YES" branch to 165 to designate the register ri as a dependent variable, and then proceeds to 169. However, if it is determined in 163 that the positive and negative cofactors of ri are not complements to each other, the method proceeds from 163 along the "NO" branch to 167 to designate ri as not being a dependent variable. The method then proceeds to 169 to determine whether there are more registers for which to test dependency. If there are more registers the method proceeds along the "YES" branch to 171 to increment "i" by one, and then to 157 to select a new register ri. However, if it is determined in 169 that there are not more registers the method proceeds along the "NO" branch from 169 to 173 and ends.

FIG. 2 depicts a method 200 of partitioning a system design model into smaller, more computationally manageable components. The partitioned components of the system design may then be independently checked for dependent state variables. An effort to detect dependent registers must consider either the exact set of reachable states for the set of registers being analyzed, or an overapproximation of the reachable states (i.e., a set that may include some truly unreachable states). In contrast, an attempt to detect dependent registers using an underapproximation may incorrectly flag a dependency that does not hold true in all reachable states of the design. Such an error would be detrimental to downstream applications. For example, if dependency is used to reduce the size of a model for verification, incorrect dependency identification could result in an incorrect verification result.

The optimal reduction potential is achieved when the exact set of reachable states is known. The fewer unreachable states that need to be considered, the more likely and more computationally cost effective it is that dependency will be detected. However, finding the exact set of reachable states tends to be, in itself, very computationally expensive. If the objective of partitioning is for use in efficiently solving the verification problem, then the process of obtaining the exact set of reachable states may require more effort than is necessary since the exact reachable state solution could be used to solve the verification problem in itself. Instead of using the exact reachable state solution of the overall design, it may be more efficient to use reachable state solutions for partitions of the overall design, each of which is itself an overapproximation. Such overapproximations tend to be much less computationally expensive than solving for the exact set of reachable states.

An overapproximation of the reachable states can be achieved by analyzing portions of the design in isolation. For example, the register ri can be analyzed by identifying the overapproximation consisting of the smallest possible set of registers likely to form a dependency with ri. In some instances ri may be precluded entirely if it is sufficiently unlikely that any dependency will be found. The size of the partitioning is important since reductions in the size of the register set decrease the computational requirements of performing reachable state analysis. On the other hand, accuracy is also needed because register set partitions that are too small may result in actual dependencies being missed.

The method 200 of FIG. 2 partitions the system design model into smaller register sets that are overapproximations of the exact set of reachable states for registers ri. Once the system design has been partitioned, the resulting smaller register set components can be used in the analysis to check for dependent state variables. The method 200 begins at 201 and proceeds to 203 where one of the system design registers ri is selected for analysis. The method then proceeds to 205 to identify the inputs and registers in the support of ri. This set of supporting inputs and registers is called R1. The support for register ri includes all other registers and inputs that fan-in to the register ri—that is, which appear in the next state function of ri. The next state function of register ri may be uniquely determined as a function of such supporting registers and inputs. More generally, this analysis can be extended to k-step support detection. For example, instead of including just the registers appearing in the next-state function of ri, the registers in the next-state functions of the registers in R1 for 2-step support analysis can be included. Upon completing 205 the method proceeds to 207.

In 207 the set of registers R2 whose support overlaps with R1 is identified. The registers R2 are those registers whose inputs are affected by the registers in R1 (or a subset of R1). Depending upon the particular implementation, R2 may be defined either broader to include more registers or narrower to include fewer registers. In accordance with one embodiment, R2 may be defined to include only those registers whose support includes registers and inputs of R1, excluding any register which contains any support register or input outside of R1. In another embodiment, R2 may be more broadly defined to include all registers that overlap in support of R1, regardless of whether or not they are also supported by registers outside of R1—that is, all the registers that fan-out from the registers and inputs of R1. This second definition of R2 enhances the dependency identification potential at the cost of additional run-time. By way of illustration consider the example where R1 has only a single register r1, with ri having a next-state function equal to r1. In this example there may exist two other registers rj and rk, with rj being defined as the next-state function "r1 AND r2", and rk with the next-state function is "r1 AND NOT r2." It should be noted that r1 is dependent upon both rj and also rk (r1 is equal to rj OR rk). Yet, in the first embodiment of R2 mentioned above there is no attempt to identify this dependency because, in practice, it has been found that doing so tends to increase the amount of work without significantly increasing the chance of finding a dependency. Additionally, attempts to identify a dependency over rj or rk at a later iteration may result in the dependency of ri being incidentally found.

Upon completing 207 the method proceeds to 209 to make an assessment of whether R2 is a proper size for analyzing the reachable states of the component and conducting a dependency analysis. R2 may be deemed to be too large either if it has too many elements or if it would require too many resources to compute the reachable state solution. In other words, the determination of whether R2 is unacceptably large may be based either on absolute size limitations or on a relationship based on computing resource constraints. For example, the maximum acceptable size of R2 could be defined in terms of a number of registers (e.g., 20 elements; 100 elements; 1 k elements; 100 k elements, or anything in between). Alternatively, the limit for R2 could be specified as the number of elements estimated to require a given limit of processing resources (e.g., anywhere in the range of 10 seconds to 100 minutes of computing at a rate of 1 MIPS to 100 MIPS; or a gross number of computer instructions such as a number within the range of 107 to 1011 instructions). If R2 is determined in 209 to be a proper size the method proceeds along the "YES" branch to 213. However, if R2 is determined to be unacceptably large the method proceeds along the "NO" branch to 211.

In block 211 steps may be taken in one or more preprocessing routines to reduce the size of R2. In some embodiments similar preprocessing routines may be performed on R1 to adjust its size. Depending upon the implementation, different criteria may be used to select the registers to eliminate (or add) in making adjustments to the size of the register set R2. For example, the process may select as the registers to delete from R2 those that are the most computationally burdensome. A rule of thumb for this may be to select those registers from R2 having the largest fan-in of circuitry. In addition to reducing the size of R2, an assessment may have been made in 209 that more elements can be added to R2 without introducing undue calculation costs. In such instances the preprocessing of 211 adds elements to R2. Upon completing the preprocessing to size adjust R2 in 211 the method proceeds to 213 to consider the reachability analysis for R2. The process in 213 assesses whether it seems promising to analyze the reachable states of the component to determine dependency. For example, if there are any elements in the support of ri that are not present in the support of R2 minus ri then it is unlikely that a dependency will be detected. A further assessment of the size may be made at this time as well, as to whether the computational costs of checking the reachability will be unacceptably large. If R2 is deemed too big in 213 for the reachability test the method proceeds from 213 along the "RESIZE" branch back to 211 for further preprocessing to adjust the size of R2. If it is determined in 213 that it would simply not be worthwhile to conduct the reachability analysis, the method proceeds from 213 along the "END" branch to 221 to end the processing for the ri register and select another register, if any. However, back in 213 if it is determined that it would be promising to perform the reachability analysis the method proceeds from 213 along the "PERFORM" branch to 215.

In 215 reachability analysis is performed on the partitioned component R2 to verify that the overapproximation includes all the reachable states of ri. The reachability analysis may be performed in accordance with the method depicted in FIG. 3 which terminates the analysis in the event a point is reach that shows little promise of further results being found. Returning to 215 of FIG. 2, upon completing this analysis the method proceeds to 217 to determine whether the overapproximation processing for the component set of registers is complete. If it is determined in 217 that further processing is needed, for example, because the computations would still be unacceptably burdensome, or if the register set R2 is determined to be missing elements or inadequate in any way, the method proceeds along the "NO" branch back to 203 for further processing of the same register ri, or to select a different register ri. If the same register is selected again in 203, the method in 205 may readjust the selections of inputs and registers supporting ri and begin the overapproximation process again. Back in 217, if the overapproximation is determined to be suitable the method proceeds along the "YES" branch to 219. In 219 the information concerning the overapproximation is formatted and recorded for use in further analysis.

Upon completing 219 the method proceeds to 221 to determine whether there are more registers in the system design model to be considered for including in a partition—that is, whether it is desired to further divide the design model into smaller sized, independent component set overapproximations. If there are more registers to process, the method proceeds from 221 along the "YES" path to 223 where "i" is incremented by one (to select the next register ri). The method then proceeds back to 203 to select a register and begin the process again. Back in 221, if it is determined that all registers in the design model have been allotted to a partition, the method proceeds from 221 along the "NO" branch to 225. In 225 a dependency analysis, or any other type of desired analysis, may be performed on the smaller, independent partitions. Upon completing 225 the method proceeds to 227 and ends.

FIG. 3 is a flowchart 300 depicting a method for early termination of dependency analysis computations. Reachability analysis tends to be the most computationally expensive part of dependent variable analysis. The method depicted in FIG. 3 truncates an on-going reachability analysis if it is unlikely to produce further results. Reachability analysis is often performed using symbolic algorithms (e.g., using BDDs) that compute all initial states, then all states reachable in one step from the initial states, then two steps, and so on. As states are explored, they are added to a reached state data structure. Once no more new states are encountered during a step of reachability analysis this process may terminate, unless terminated earlier by the following process.

The method 300 begins at 301 and proceeds to 303 to create or otherwise obtain the BDD for the register ri slated to undergo reachability analysis. In practice the BDD may be created as part of the reachability analysis itself. Although various formats may be used for the system design, typically a graphical data structure such as a BDD is used to conduct the reachability analysis. For illustrative purposes, the present discussion centers on the use of BDDs to perform the reachability analysis and check for dependency at each image computation. The BDD reflects the outputs of the various registers in the model for the time t. In the first iteration for a register the BDD typically reflects the initial condition states of the registers in the model. The initial condition may be referred to as the state at t=0, although this does not necessarily imply a point in time or that time passes at a particular rate as the model progresses through its states. The progressive states of the model may simply be iterations of the model as the registers, latches or other state holding elements change states due to changes in their inputs. As such, the set of states of the model at t=1 simply implies that an iteration has taken place or the next set of states has been reached (following the states at t=0), rather than implying that a certain amount of time has passed. Furthermore, the present example discusses a reachability analysis being performed for a single register ri. However, in practice the reachability analysis may be performed for a number of registers, such as an entire system design that includes ri, an independent partition such as that produced by the method described above in conjunction with FIG. 2, or may be performed for a single register ri.

Once the BDD for the reachability analysis has been obtained in 303 the method proceeds to 305 to perform the reachability analysis for the present step (initially the step associated with t=0, and then t=1, and so on). A reachability step (or image computation) may also be referred to as a reachability iteration of the model. Once the reachability calculations for the step (iteration) are completed the method proceeds to 307 to determine whether the entire reachability analysis is finished. If it is determined in 307 that the reachability analysis is completed the method proceeds from 307 along the "YES" branch to 323 to format the results. However, if the reachability analysis is not yet done the method proceeds from 307 along the "NO" branch to 309. In block 309 it is determined whether or not to interrupt the reachability calculations to check for dependencies at this particular juncture or state. In accordance with various embodiments the reachability computation is periodically interrupted to check for dependencies. In one embodiment the reachability analysis is halted to perform a check for the dependency of register ri at each image computation, that is, at each step or iteration of the state machine model. In other embodiments the reachability analysis may not necessary be interrupted at each image, and instead be interrupted at every other image or every third image, or at the iterations beginning after a predetermined number of images (e.g., after the fifth image, tenth image, etc.). In some implementations the dependency check is not performed during the first reachability iteration for a variable (or before a predetermined number of states, e.g., the first two states, first five states, or any number in between). This delay in interrupting the reachability analysis is because at the initial conditions all registers are set to 0 causing many false equivalencies. If it is determined in 309 not to interrupt the reachability analysis for a dependency check the method proceeds along the "NO" path to 315. However, if a determination is made in 309 to interrupt the reachability calculations then the method proceeds from 309 along the "YES" path to 311.

In 311 the system pauses the reachability calculations to check for dependencies. As mentioned above, at the beginning of the reachability analysis for a register more potential dependencies are likely to exist. Then, as states are added to the intermediate reached state set, the number of dependencies will likely be reduced. Dependencies for a given register can only be eliminated as the reachability calculations proceed, not added. A dependency occurs when the output of a register may be expressed as function of the outputs of other registers in the system for all reachable states. A dependency analysis may be done using any of several dependency check processes, including for example, the bdd_cofactor function. This sets the states of all registers in the BDD to the values that occur when the register being evaluated is at 1 (or at 0). The function bdd_cofactor indicates that register ri is a dependent register if the state set BDD of bdd_cofactor for ri=0 is the complement (opposite) of the state set BDD of bdd_cofactor for ri=1. The bdd_cofactor function is discussed in further detail above, in conjunction with FIG. 1B. Once the check for dependencies has been completed in 311 the method proceeds to 313.

If it is determined in 313 that a dependency still exists—that is, the register ri is still considered a dependent register of other registers in the model—the method proceeds from 313 along the "YES" path to 315 to continue with the reachability calculations. In accordance with some embodiments, a register contribution analysis may be performed in 315 to dynamically eliminate useless variables. The register contribution analysis is discussed further in conjunction with FIG. 4B. From 315 the method proceeds to 317 to increment time t by 1 and begin analyzing the reachability for register ri at another state set for the model. Returning to 313, if it is determined that there are no remaining dependencies for register ri, the method proceeds from 313 along the "NO" path to 319.

At some point in the reachability calculations, if no dependencies are found for the register ri, the decision may be made to truncate the reachability analysis early. In some embodiments the truncation may be specified to occur at the first state or image that no dependencies are found. In other embodiments, the reachability calculations may proceed for a predetermined number of iterations past the state when no dependencies were found (e.g., one more iteration, ten more iterations, or any number in between or like amount). If the reachability analysis is to run for a predetermined number of iterations beyond the detection of no dependencies the method proceeds from 319 along the "NO" path to 317. If it is decided in 319 to end the reachability analysis for the register ri, the method proceeds from 319 along the "YES" branch to 321 where the reachability calculations for register ri are ceased, it having been determined that continuing the reachability calculations for ri will not likely yield any substantive results. The method then proceeds to 323 to format and save the results of the truncated reachability analysis for future use and analysis. Upon completing 323 the method proceeds to 325 and ends.

FIG. 4A is a flowchart 400 depicting a method to dynamically eliminate non-contributing variables based on the support of the binary decision diagram. A non-contributing variable is a variable for which a determination has been that the variable cannot contribute to dependency. Eliminating such useless variables helps to speed up the reachable state analysis (and the dependency analysis), since the fewer registers contained within the component being analyzed, the faster the computation will be performed. For this reason it is desirable to prune registers from the set once it is determined that they cannot be useful for dependency analysis. The process depicted in FIG. 4A can be performed in various situations and embodiments. For example, in the embodiment depicted in FIG. 4A, the method 400 is performed as part of a reachability analysis after every reachability step to remove useless variables from further consideration in the reachability analysis (e.g., block 315 of FIG. 3). In another embodiment this process may be performed as part of a dependency analysis, again to remove useless variables from further consideration.

The method 400 begins at 401 and proceeds to 403 where a reachability iteration has been completed, for example, completing the reachability calculations of register ri for the state set at time (or iteration) t=x, where x represents an increment or time at which state values are outputted, t=0, t=1, etc. The method then proceeds to 405 to check for dependency of the register ri being evaluated. This may be done, for example, by using the bdd_cofactor BDD function mentioned above. In some instances, the embodiment of FIG. 3 for truncating the analysis if no dependencies are found may be performed in conjunction with the embodiment of FIG. 4. In such instances steps from the embodiment of FIG. 3 may be performed in block 405. Once the dependency check of register ri is completed in 405 the method proceeds to 407 to begin evaluating the registers that cannot contribute to the dependency of register ri. In 407 a variable is selected to check its contribution, the variable being a register currently remaining in the BDD other than register ri. The method then proceeds from 407 to 409.

In block 409 a fast check is performed to see whether the given variable does not appear in the support of the reachable state BDD. If it does not appear in the support, then that variable appears both as a 0 and 1 for all valuations to the other registers. Such variables can be pruned from future BDD analysis without sacrificing any accuracy. If the selected variable does not appear in the support the method proceeds from 409 via the "NO" branch to 411 to eliminate the variable from future analysis, and then on to 415 to select another variable, if any. Returning to 409, if it is determined that the variable does appear in the support of the reachable state BDD, then the variable is retained, for the time being, rather than being pruned. The method proceeds from 409 to 413 via the "YES" branch for a secondary contribution test in 413.

In accordance with some embodiments, a secondary test may be performed in 413 to check whether the variable participates in any potential dependency for ri. If the variable under consideration does not participate in any potential dependency for ri, the method proceeds from 413 along the "NO" path to 411 and the variable is eliminated from further consideration in the analysis. However, if the variable under consideration does participate in a potential dependency for ri the method proceeds from 413 along the "YES" path to 415 and the register (variable) is retained. In 415 it is determined whether there are any more registers to be considered. If there are more registers to consider the method proceeds from 415 along the "YES" path to 407 to select another variable for evaluation. However, if it is determined in 415 that there are no more variables to consider the method proceeds from 415 along the "NO" path to 417 to determine whether the reachability analysis has been completed.

If it is determined in 417 that the reachability analysis has not yet been completed the method proceeds from 417 along the "NO" branch to 419 to increment t by 1. The method then proceeds to 421 to perform another reachability step, and then on to 405 to begin the process of eliminating non-contributing variables again. However, back in 417 if it is determined that the reachability analysis has been completed the method proceeds from 417 along the "YES" branch to 423 and ends.

FIG. 4B is a flowchart depicting a method 450 to dynamically eliminate non-contributing variables based on an ability to contribute to a minimally sized dependency. This method enumerates the variables that can contribute to a minimally-sized dependency. Assume that a dependency check indicates one or more registers to be dependent. A next part of the process involves finding the minimally-sized dependencies for the dependent variables. The process is discussed herein in terms of an analysis for the variable ri, however, the process may also be carried out for a set of two or more variables, for example, the registers ri and rj. In short, the process involves iteratively "existentially quantifying" registers one at a time from the reached state BDD. This refers to the operations carried out in the bdd_cofactor function which involves performing a Boolean OR operation on the BDDs produced by the positive and negative cofactor with respect to the quantified variable.

The method 450 begins in 451 of FIG. 4B and proceeds to 453 where a pre-qualified reachable state set is obtained. The method proceeds to 455 to set this state set as the current state set (to identify it in this method), and then on to 457 to identify dependent registers, in this example, register ri. In 459 a first register rn in the register set other than ri is selected. The method then proceeds to 461 to remove the selected register rn from the current state set to create a state set that we will call the new state set (as opposed to the current state set that includes ri). Upon completing this the method proceeds to 463 to determine whether ri is dependent to the new state set (without rn). The variable ri is dependent if its output can be characterized by a function of one or more of the remaining registers in the new state set. If, in 463 it is determined that ri is dependent on the new state set then the method proceeds from 463 along the "YES" path to 465. In block 465 the new state set is set to be the current state set for the purposes of continuing the analysis, effectively eliminating the variable rn from future consideration. The method then proceeds from 465 to 467.

Back in 463, if it is determined that ri is not dependent on the new state set then the method proceeds from 463 along the "NO" branch to 469 to continue with the previous current state set as this set existed back in block 459. Hence, the analysis continues with the register rn after determining that ri loses its dependency without rn. Since rn has been determined to contribute to a minimally sized dependency, the method proceeds from 469 to 471 and adds rn to the set R1. Upon completing this step the method proceeds to 467 to determine whether there are more registers rn to consider. If there are more registers the method proceeds from 467 to 473 along the "YES" path. In 473 the system increments n by 1 to consider the next register rn, and then proceeds to 459. Back in 467, if it is determined that there are no further registers the method proceeds from 467 along the "NO" path to 475 and ends.

Figure 5:
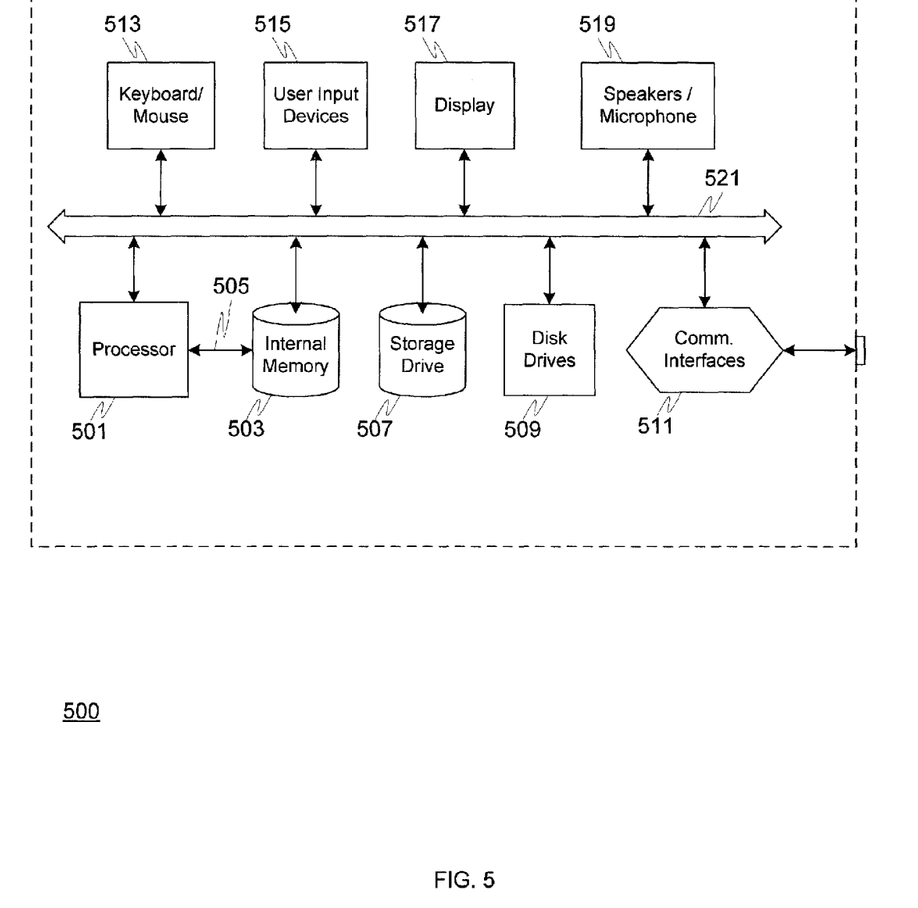
FIG. 5 depicts an exemplary computer system 500 suitable for implementing and practicing various exemplary embodiments.

FIG. 5 depicts an exemplary computer system 500 suitable for implementing and practicing various exemplary embodiments. The computer system 500 may be configured in the form of a desktop computer, a laptop computer, a mainframe computer, or any other arrangements capable of being programmed or configured to carry out instructions. The computer system 500 may be located and interconnected in one location, or may be distributed in various locations and interconnected via a local or wide area network (LAN or WAN), via the Internet, via the public switched telephone network (PSTN), or other such communication links. Other devices may also be suitable for implementing or practicing the embodiments, or a portion of the embodiments. Such devices include personal digital assistants (PDA), wireless handsets (e.g., a cellular telephone or pager), and other such consumer electronic devices preferably capable of being programmed to carry out instructions or routines.

Typically, a computer system 500 includes a processor 501 which may be embodied as a microprocessor or central processing unit (CPU). The processor 501 is typically configured to access an internal memory 503 via a bus such as the system bus 521. The internal memory 503 may include one or more of random access memory (RAM), read-only memory (ROM), cache memory, or a combination of these or other like types of circuitry configured to store information in a retrievable format. In some implementations the internal memory 503 may be configured as part of the processor 501, or alternatively, may be configured separate from it but within the same packaging. The processor 611 may be able to access internal memory 503 via a different bus or control lines (e.g., local bus 505) than is used to access the other components of computer system 500.

The computer system 500 also typically includes, or has access to, one or more storage drives 507 (or other types of storage memory) and floppy disk drives 509. Storage drives 507 and the floppy disks for floppy disk drives 509 are examples of machine readable mediums suitable for storing various final or interim results of the various embodiments. The storage drive 507 is often a hard disk drive configured for the storage and retrieval of data, computer programs or other information. The storage drive 507 need not necessary be contained within the computer system 500. For example, in some embodiments the storage drive 507 may be server storage space within a network or the Internet that is accessible to the computer system 500 for the storage and retrieval of data, computer programs or other information. For example, the computer system 500 may use storage space at a server storage farm accessible by the Internet 450 or other communications lines. The floppy disk drives 509 may include a combination of several disc drives of various formats that can read and/or write to removable storage media (e.g., CD-R, CD-RW, DVD, DVD-R, floppy disk, etc.). The computer system 500 may either include the storage drives 507 and floppy disk drives 509 as part of its architecture (e.g., within the same cabinet or enclosure and/or using the same power supply), as connected peripherals, or may access the storage drives 507 and floppy disk drives 509 over a network, or a combination of these. The storage drive 507 is often used to store the software, instructions and programs executed by the computer system 500, including for example, all or parts of the computer application program for project management task prioritization.

The computer system 500 may include communication interfaces 511 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 500 may be connected to the Internet via the wireless router 401 (or a wired router or other node—not show) rather than have a direct connected to the Internet. The components of computer system 500 may be interconnected by a bus 521 and/or may include expansion slots conforming to any of various industry standards such as PCI (Peripheral Component Interconnect), ISA (Industry Standard Architecture), or EISA (enhanced ISA).

Typically, the computer system 500 includes one or more user input/output devices such as a keyboard and/or mouse 513, or other means of controlling the cursor (e.g., touch-screen, touchpad, joystick, trackball, etc.) represented by the user input devices 515. A display 517 is also generally included as part of the computer system 500. The display may be any of several types of displays, including a liquid crystal display (LCD), a cathode ray tube (CRT) monitor, a thin film transistor (TFT) array, or other type of display suitable for displaying information for the user. The display 517 may include one or more light emitting diode (LED) indicator lights, or other such display devices. In addition, most computer systems 500 also include, or are connected to, one or more speakers and microphones 519 for audio output and input. Speech recognition software may be used in conjunction with the microphones 519 to receive and interpret user speech commands.

The invention may be implemented with any sort of processing units, processors and controllers (e.g., processor 501 of FIG. 5) capable of performing the stated functions and activities. For example, the processor 501 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one exemplary embodiment can operate computer software programs stored (embodied) on a computer-readable medium such as the internal memory 503, the storage drive 507, or other type of machine-readable medium, including for example, floppy disks, optical disks, a hard disk, CD, flash memory, ram, or other type of machine readable medium as recognized by those of ordinary skill in the art.

State holding elements, or state elements, are discussed above in terms of being implemented as registers. However, in some embodiments any sort of state holding element may be used to implement various embodiments, including for example, registers, latches, state machines, or the like. For the purposes of illustrating and explaining the invention the terms variable and register have been used interchangeably throughout this disclosure.

Regarding the flowcharts depicted in FIGS. 1A-4B, various method activities may be included or excluded as described above, or performed in a different order than shown in the figures, and still remain within the scope of at least one exemplary embodiment. For example, in some implementations of the FIG. 3 method the system may perform a register contribution analysis 315 during each instance the reachability analysis is interrupted, while other implementations will not perform a contribution analysis at this juncture, instead proceeding from 313 along the "YES" branch to 317. In another example of implementations that may vary from the figures, the method of FIG. 4A may, in some implementations, be performed without any secondary contribution analysis as per block 413. In yet other implementations the test in block 413 may be performed instead of block 409. It is understood that the scope of the present invention encompasses other such omissions, additions, or changes to the flow charts and figures.

The computer software products or application programs can aid in the performance of, or perform, the various steps and activities described above. For example computer programs in accordance with at least one exemplary embodiment may include source code for partitioning a model by: selecting a variable from among a plurality of variables of a model being analyzed; identifying a first set of variables that support the selected variable; and identifying a second set of variables among the plurality of variables with support overlapping the first set of variables, this second set of variables being an overapproximation partition of the reachable states of the selected variable. Various other embodiments may include source code for truncating a reachability analysis by: creating a binary decision diagram for a selected variable; performing reachability computations; interrupting the reachability analysis to perform a dependency check; and truncating the reachability analysis for the selected variable in response to a finding that there are no remaining dependencies. Various other embodiments may include source code for pruning a model of non-contributing variables during a reachability analysis by: completing an iteration of the reachable state calculations; selecting a variable from the model; determining whether the selected variable contributes to the dependency of the variable being analyzed; and discarding the selected variable in response to determining that it cannot contribute to dependency of said variable being analyzed. Various other embodiments may include source code for pruning a model of non-contributing variables during a reachability analysis by: selecting a variable from the model upon completing a reachable state iteration; removing the selected variable from the current state set to create a new state set; determining whether the variable being analyzed is dependent on the new state set; and retaining the new state set to continue with the reachability analysis if it is determined that the variable being analyzed is dependent on the new state set. The various embodiments may include source code for the other activities illustrated in the figures or otherwise described herein. For example, there are many further source codes that may be written to perform the stated steps and procedures above, and these are intended to lie within the scope of exemplary embodiments.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method of partitioning a model of a circuit diagram representing an electrical circuit comprising a plurality of variables representing state elements in said electrical circuit, the method comprising:
    select a variable from the plurality of variables;
    identify a first set of variables among the plurality of variables that each support said selected variable;
    identify a second set of variables among the plurality of variables that each have support overlapping said first set of variables; and
    storing said second set of variables on a machine readable medium;
    wherein said second set of variables is a partition of state elements suitable for use in determining an overapproximation of reachable states of said selected variable.

2. The method of claim 1,
    wherein said plurality of variables represent a plurality of registers.

3. The method of claim 1,
    wherein an output of each of the first set of variables affects an output of the selected variable; and
    wherein an output of each of the second set of variables is affected by the output of each of the first set of variables.

4. The method of claim 1, wherein an output of each of the second set of variables is affected by a set of outputs of the first set of variables that serve as inputs to the selected variable.

5. The method of claim 1, further comprising:
    perform a reachability analysis on said second set of variables;
    wherein the reachability analysis is performed using a binary decision diagram.

6. The method of claim 1, further comprising:
    conduct a size evaluation to determine whether said second set of variables is within an acceptable size; and
    perform preprocessing to adjust a size of said second set of variables to within said acceptable size.

7. The method of claim 6, wherein said acceptable size is based upon one of a group consisting of a predetermined maximum number of the second set of variables, a predetermined minimum number of the second set of variables, and a maximum amount of computing resources associated with reachability computations for the second set of variables.

8. The method of claim 1, wherein said method comprises steps performed by a computer or processor.

9. A software product comprising a machine readable medium including a program of instructions for partitioning a model comprising a plurality of variables representing state elements, wherein the program of instructions upon being executed on a computer causes the computer to perform activities comprising:
    select a variable from the plurality of variables;
    identify a first set of variables among the plurality of variables that each support said selected variable; and
    identify a second set of variables among the plurality of variables that each have support overlapping said first set of variables;
    wherein said second set of variables is a partition of state elements suitable for use in determining an overapproximation of reachable states of said selected variable.

10. The software product of claim 9, further comprising:
    perform a reachability analysis on said second set of variables using a binary decision diagram;
    conduct a size evaluation to determine whether said second set of variables is within an acceptable size; and
    perform preprocessing to adjust a size of said second set of variables to within said acceptable size.

11. The software product of claim 10, wherein said acceptable size is based upon one of a group consisting of a predetermined maximum number of the second set of variables, a predetermined minimum number of the second set of variables, and a maximum amount of computing resources associated with reachability computations for the second set of variables.

12. The software product of claim 9,
    wherein said model is a circuit diagram representing an electrical circuit; and
    wherein said plurality of variables represent a plurality of registers.

13. The software product of claim 9,
    wherein an output of each of the first set of variables affects an output of the selected variable; and
    wherein an output of each of the second set of variables is affected by the output of each of the first set of variables.

14. The software product of claim 9, wherein an output of each of the second set of variables is affected by a set of outputs of the first set of variables that serve as inputs to the selected variable.

15. A system for partitioning a model comprising a plurality of variables representing state elements, the system comprising:
    a display device configured to display a variable selected from the plurality of variables;
    a processor configured to identify a first set of variables among the plurality of variables that each support said selected variable, wherein said processor is further configured to identify a second set of variables among the plurality of variables that each have support overlapping said first set of variables; and a memory configured to store said second set of variables on a machine readable medium;
wherein said second set of variables is a partition of state elements suitable for use in determining an overapproximation of reachable states of said selected variable.

16. The system of claim 15, wherein said processor is further configured to perform a reachability analysis on said second set of variables using a binary decision diagram, conduct a size evaluation to determine whether said second set of variables is within an acceptable size, and perform preprocessing to adjust a size of said second set of variables to within said acceptable size.

17. The system of claim 15,
wherein said model is a circuit diagram representing an electrical circuit; and
wherein said plurality of variables represent a plurality of registers.

18. The system of claim 15,
wherein an output of each of the first set of variables affects an output of the selected variable; and
wherein an output of each of the second set of variables is affected by the output of each of the first set of variables.

19. The system of claim 15, wherein an output of each of the second set of variables is affected by a set of outputs of the first set of variables that serve as inputs to the selected variable.

20. The system of claim 15, wherein said acceptable size is based upon one of a group consisting of a predetermined maximum number of the second set of variables, a predetermined minimum number of the second set of variables, and a maximum amount of computing resources associated with reachability computations for the second set of variables.

* * * * *